(12) United States Patent
Chistyakov et al.

(10) Patent No.: US 9,951,414 B2
(45) Date of Patent: *Apr. 24, 2018

(54) MAGNETICALLY ENHANCED HIGH DENSITY PLASMA-CHEMICAL VAPOR DEPOSITION PLASMA SOURCE FOR DEPOSITING DIAMOND AND DIAMOND-LIKE FILMS

(71) Applicant: IonQuest LLC, Mansfield, MA (US)

(72) Inventors: Roman Chistyakov, North Andover, MA (US); Bassam Hanna Abraham, Millis, MA (US)

(73) Assignee: IONQUEST LLC, Mansfield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/261,119

(22) Filed: Sep. 9, 2016

(65) Prior Publication Data
US 2017/0175253 A1 Jun. 22, 2017

Related U.S. Application Data

(60) Provisional application No. 62/270,356, filed on Dec. 21, 2015.

(51) Int. Cl.
*C23C 14/14* (2006.01)
*C23C 14/35* (2006.01)
(Continued)

(52) U.S. Cl.
CPC ........ *C23C 14/354* (2013.01); *C23C 14/0057* (2013.01); *C23C 14/0605* (2013.01);
(Continued)

(58) Field of Classification Search
CPC ... C23C 14/0057; C23C 14/14; C23C 14/354; C23C 14/345; C23C 14/0605; H01J 37/3426; H01J 37/345; H01J 37/3464
(Continued)

(56) References Cited

U.S. PATENT DOCUMENTS

| 5,482,611 A * | 1/1996 | Helmer | H01J 37/32192 |
| | | | 204/192.12 |
| 7,327,089 B2 * | 2/2008 | Madocks | H01J 27/146 |
| | | | 118/723 DC |

* cited by examiner

Primary Examiner — Rodney G McDonald
(74) Attorney, Agent, or Firm — Hoffmann & Baron, LLP

(57) ABSTRACT

A magnetically enhanced HDP-CVD plasma source includes a hollow cathode target and an anode. The anode and cathode form a gap. A cathode target magnet assembly forms magnetic field lines that are substantially perpendicular to a cathode target surface. The gap magnet assembly forms a cusp magnetic field in the gap that is coupled with the cathode target magnetic field. The magnetic field lines cross a pole piece electrode positioned in the gap. This pole piece is isolated from ground and can be connected with a voltage power supply. The pole piece can have a negative, positive, or floating electric potential. The plasma source can be configured to generate volume discharge. The gap size prohibits generation of plasma discharge in the gap. By controlling the duration, value and a sign of the electric potential on the pole piece, the plasma ionization can be controlled. The magnetically enhanced HDP-CVD source can also be used for chemically enhanced ionized physical vapor deposition (CE-IPVD). Gas flows through the gap between hollow cathode and anode. The cathode target is inductively grounded, and the substrate is periodically inductively grounded.

16 Claims, 16 Drawing Sheets

(51) Int. Cl.
    *C23C 14/00*          (2006.01)
    *C23C 14/34*          (2006.01)
    *C23C 14/06*          (2006.01)
    *H01J 37/34*          (2006.01)

(52) U.S. Cl.
    CPC ............ *C23C 14/14* (2013.01); *C23C 14/345* (2013.01); *H01J 37/345* (2013.01); *H01J 37/3426* (2013.01); *H01J 37/3464* (2013.01)

(58) Field of Classification Search
    USPC ............ 204/192.12, 298.06, 298.08, 298.16, 204/298.17, 298.18, 298.19
    See application file for complete search history.

MAGNETICALLY ENHANCED HIGH DENSITY PLASMA-CHEMICAL VAPOR DEPOSITION PLASMA SOURCE FOR DEPOSITING DIAMOND AND DIAMOND-LIKE FILMS

CROSS-REFERENCE TO RELATED APPLICATIONS

This application claims the benefit of U.S. Provisional Application No. 62/270,356, filed Dec. 21, 2015, the disclosure of which is incorporated herein by reference in its entirety. U.S. application Ser. No. 15/260,841 entitled "Capacitive Coupled Plasma Source for Sputtering and Resputtering", U.S. application Ser. No. 15/260,857 entitled "Electrically and Magnetically Enhanced Ionized Physical Vapor Deposition Unbalanced Sputtering Source", and U.S. application Ser. No. 15/261,197 entitled "Magnetically Enhanced Low Temperature-High Density Plasma-Chemical Vapor Deposition Plasma Source for Depositing Diamond and Diamond Like Films" filed concurrently herewith are incorporated herein by reference in their entireties.

BACKGROUND

Field

The disclosed embodiments generally relate to a plasma enhanced chemical vapor deposition (PE CVD) apparatus and method and, more particularly, relate to a pulse magnetically enhanced low temperature high density plasma chemical vapor deposition (LT HDP CVD) apparatus and method.

Related Art

CVD plasma sources that deposit diamond and diamond-like coatings and films use hot filament chemical vapor deposition (HFCVD) and microwave assisted chemical vapor deposition (CVD) techniques. Both methods require a high temperature on a substrate in order to form a carbon film with a high content of sp3 bonds. Accordingly, new CVD technologies are needed that will allow depositing diamond-like carbon (DLC) films at much low temperatures.

SUMMARY

Various embodiments relate to an apparatus, method, and system for pulse magnetically enhanced high density plasma chemical vapor deposition (HDP CVD) depositions of thin-film coatings, and in particular diamond and diamond like coatings.

The magnetically enhanced HDP-CVD source includes (a) a hollow cathode target assembly connected to a power supply, which can include a pulsed power supply, variable power direct current (DC) power supply, radio frequency (RF) power supply, pulsed RF power supply, high power impulse magnetron sputtering (HIPIMS) power supply, or a combination of any of these power supplies, (b) an anode that is connected to ground, (c) a gap between a hollow cathode target and an anode, (d) two rows of permanent magnets or electromagnets that are positioned on top of each other in order to generate a cusp magnetic field in the gap between the hollow cathode and the anode, (e) a cathode magnet assembly that can be configured to generates magnetic field lines perpendicular to a surface of the hollow cathode target, (f) a magnetic coupling between the cathode target magnet assembly and a cusp magnetic field in the gap, and (g) a flowing liquid that cools and controls the temperature of the hollow cathode.

The magnetically enhanced CVD source may include (a) a pole piece between the two rows of magnets that are exposed to the plasma through the gap between the hollow cathode and the anode, (b) a pole piece positioned on top of a top row of the magnets, (c) a gap in the anode that exposes a pole piece positioned on top of the top row of magnets to the plasma, (d) gas distribution system, (e) an inductor connected between the cathode and ground, (f) a motor that can rotate a cathode magnet assembly, and (g) a power supply connected to a pole piece, (e) an inductor connected between the pole piece and ground.

The magnetically enhanced CVD apparatus includes (a) a magnetically enhanced CVD source, (b) a vacuum chamber, (c) a substrate holder, (d) a substrate, (e) a feed gas mass flow controller, and (f) a vacuum pump.

The magnetically enhanced HDP-CVD apparatus may include (a) a DC or RF substrate bias power supply, (b) a substrate heater, (c) more than one magnetically enhanced PVD sources, (d) a gas activation source, (a) an additional magnet assembly positioned between the magnetically enhanced HDP-CVD plasma source and the substrate holder or positioned below the substrate holder. The magnet assembly can be positioned inside or outside a vacuum chamber.

A method of providing magnetically enhanced HDP-CVD thin film deposition includes (a) forming a cusp magnetic field in a gap between a hollow cathode and an anode, (b) forming magnetic field lines perpendicular to a bottom surface of the hollow cathode, (c) providing feed gas, (d) applying negative voltage to the cathode target and igniting volume plasma discharge, (e) and positioning a substrate.

The method of providing magnetically enhanced CVD thin film deposition may include (a) heating the substrate, (b) applying bias voltage to the substrate, (c) applying a RF voltage to the pole piece, (d) applying a RF voltage to the cathode target, (e) synchronizing the RF voltage applied to the pole piece and RF voltage applied to a cathode target.

A magnetically enhanced chemical vapor deposition (CVD) apparatus includes a hollow cathode target assembly; an anode positioned on top of the hollow cathode target assembly, thereby forming a gap between the anode and the hollow cathode target assembly; a cathode magnet assembly; two rows of magnets facing each other with the same magnetic field direction that generate a cusp magnetic field in the gap and a magnetic field on the hollow cathode surface with the cathode magnet assembly, the magnetic field comprising magnetic field lines that are substantially perpendicular to the hollow cathode target assembly; and a pole piece positioned between the two rows of magnets and connected to a voltage power supply, the voltage power supply generating a train of negative voltage pulses that generates a pulse electric field in the gap perpendicular to the cusp magnetic field, the electric field igniting and sustaining plasma during a pulse of the train of negative voltage pulses, a frequency, duration and amplitude of the train of negative voltage pulses being selected to increase a degree of ionization of feed gas atoms.

The magnetically enhanced CVD sputtering apparatus may include a second gap positioned inside the anode such that a portion of the magnetic field lines forming the cusp magnetic field cross the gap and terminate on top of a second row of magnets, and a radio frequency (RF) power supply connected to the hollow cathode target assembly, wherein the RF power supply generates output voltage with a frequency in a range of about 1 MHz to 100 MHz. The power supply may be connected to the hollow cathode target assembly and generate output current in a range of about 20 A to 200 A. The magnetically enhanced CVD sputtering apparatus may include a substrate holder, and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

A method of magnetically enhanced chemical vapor deposition (CVD) sputtering includes providing a hollow cathode target assembly; forming a gap between the hollow cathode target assembly and an anode; positioning a cathode magnet assembly; generating a cusp magnetic field in the gap such that magnetic field lines are substantially perpendicular to the hollow cathode surface; positioning a pole piece in the gap connected to a voltage power supply; providing a pulse DC power to the cathode target to ignite and sustain volume discharge; generating a train of negative voltage pulses using the voltage power supply; and selecting a frequency, duration, and amplitude of the train of negative voltage pulses to increase a degree of ionization of sputtered target material atoms.

The method may include positioning a second gap inside the anode such that the portion of the magnetic field lines forming the cusp magnetic field cross the gap and terminate on top of a second row of magnets, and connecting a radio frequency (RF) power supply to the hollow cathode assembly and generating output voltage with a frequency in a range of about 1 MHz to 100 MHz. The voltage power supply may generate output voltage in a range of about −100 V to −3000 V, and the method may include connecting a substrate bias power supply to a substrate holder and generating a bias voltage on a substrate in a range of about −10 V to −2000 V. The magnetic field in the gap may be in a range of about 50 G to 10000 G, and the cathode target material may include carbon and/or aluminum.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein.

Figure 1A:
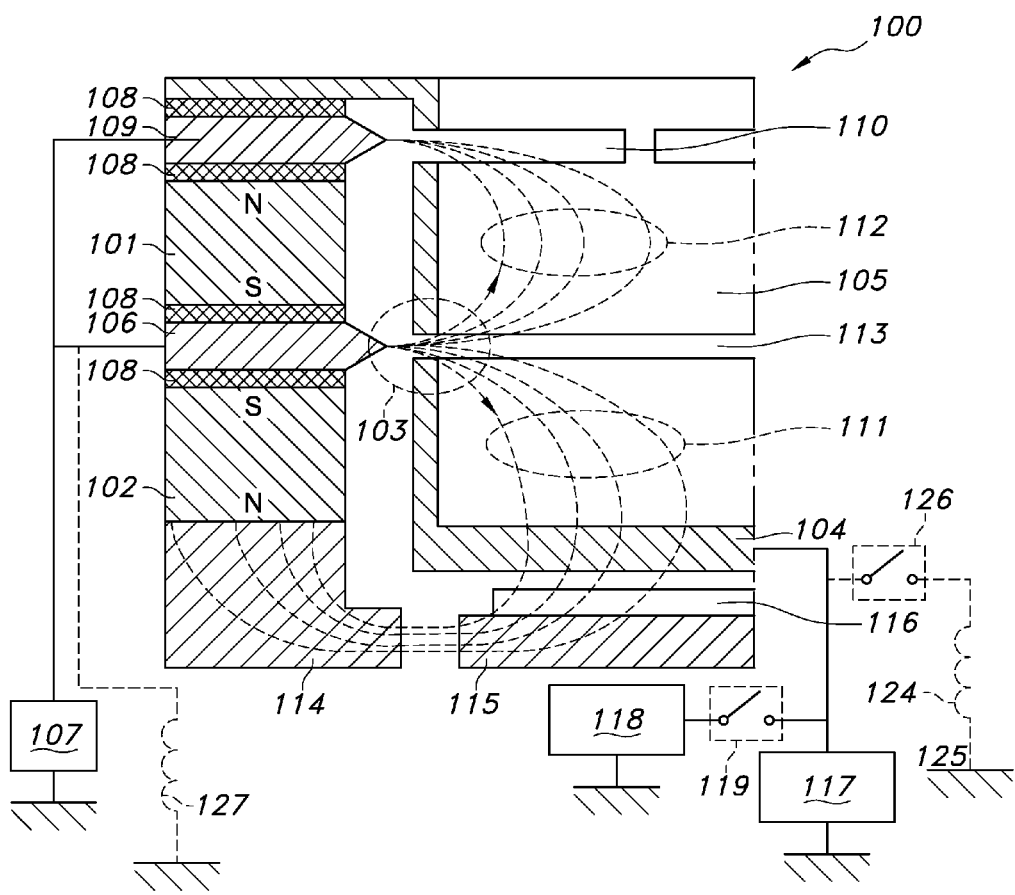
FIG. 1(a) shows an illustrative cross-sectional view of an embodiment of a magnetically enhanced chemical vapor deposition (CVD) source.
Figure 1B:
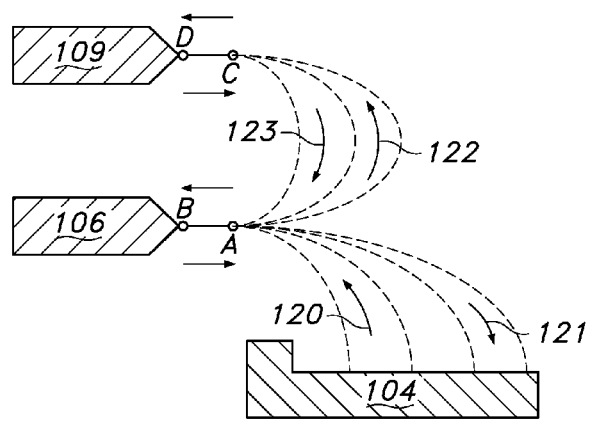
FIG. 1(b) shows an illustrative cross-sectional view of an embodiment of the magnetic field lines for the magnetically enhanced CVD source.
Figure 1C:
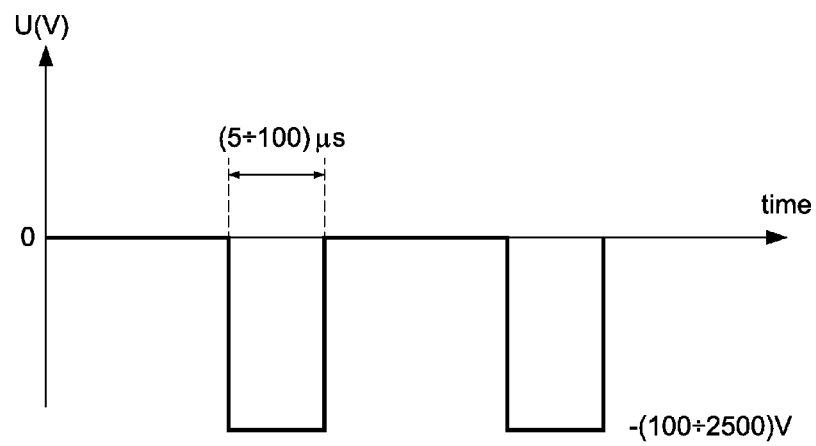
FIG. 1(c) shows a timing diagram of negative voltage pulses that can be generated by a pulsed power supply and applied to the pole piece from the magnetically enhanced CVD source.
Figure 1D:
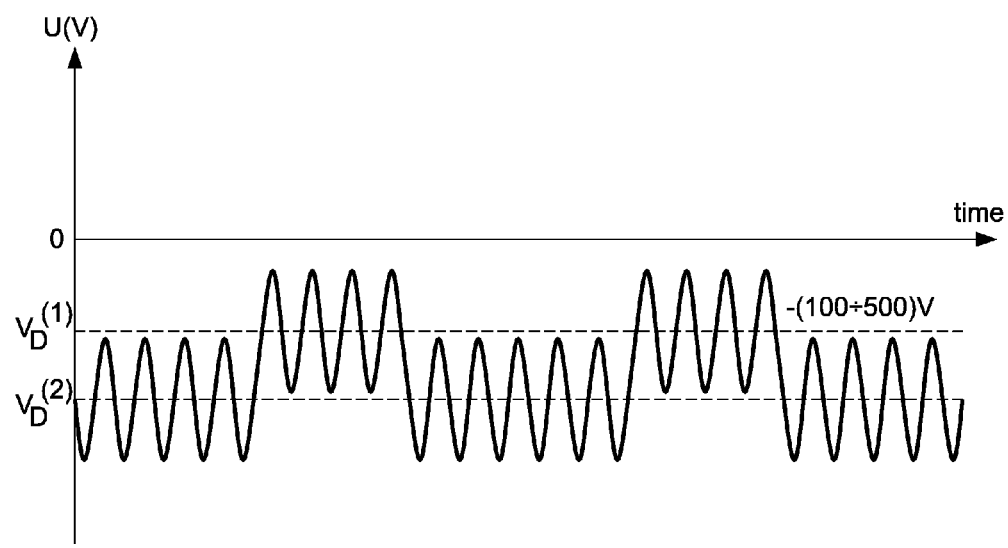
FIG. 1(d) shows a timing diagram of negative RF voltage applied to the cathode target when negative pulses are applied to the pole piece from the magnetically enhanced CVD source.
Figure 1E:
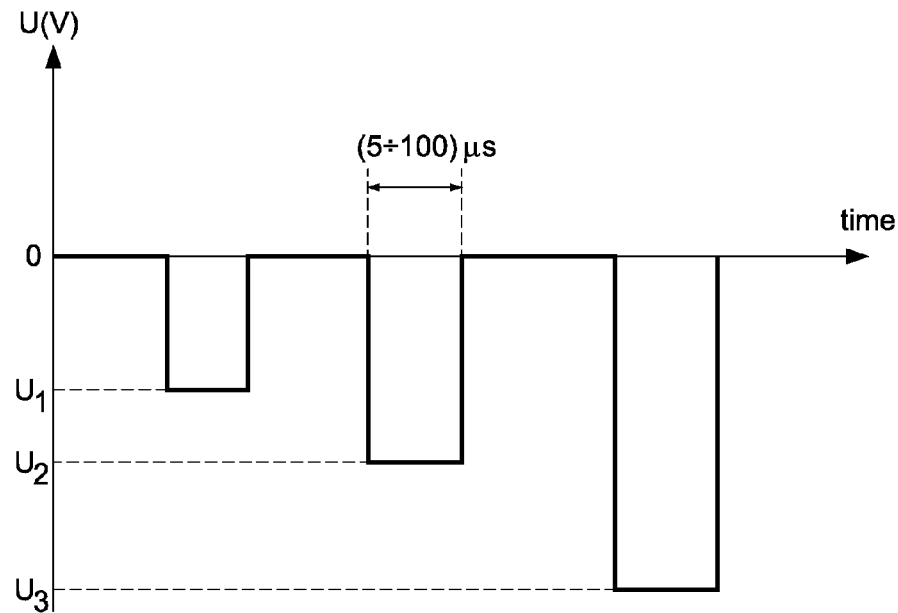
FIG. 1(e) shows a timing diagram of negative voltage pulses with different amplitudes that can be generated by a pulsed power supply and applied to the pole piece from the magnetically enhanced CVD source.
Figure 1F:
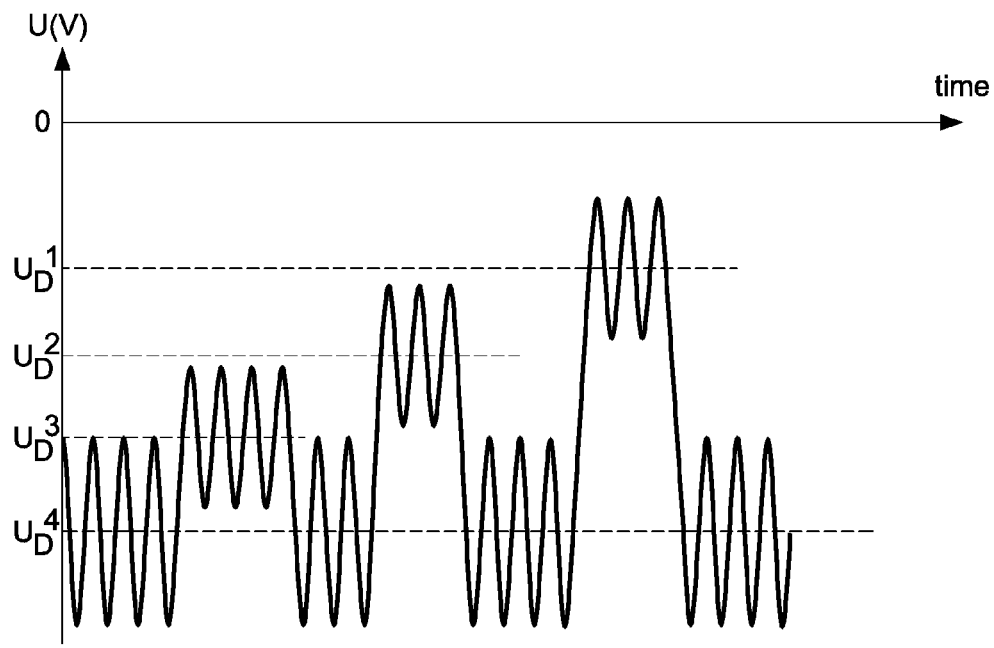
FIG. 1(f) shows a timing diagram of negative RF voltage applied to the cathode target when negative voltage pulses with different amplitudes are applied to the pole piece from the magnetically enhanced CVD source.
Figure 1G:
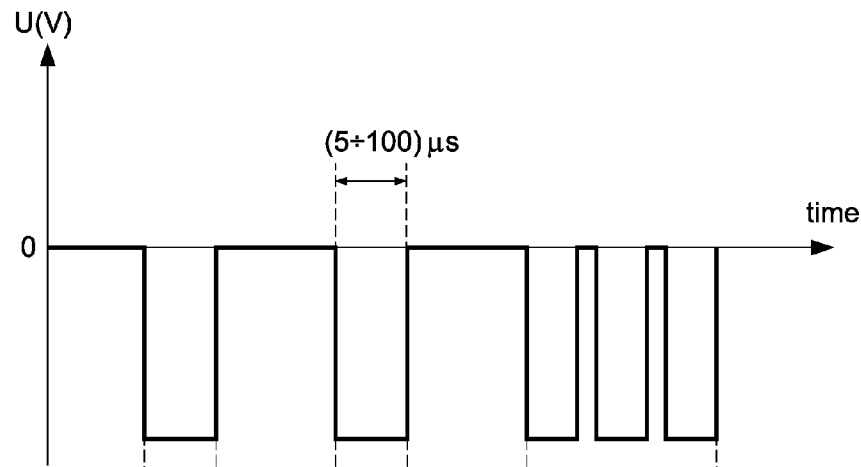
FIG. 1(g) shows a timing diagram of negative voltage pulses with different frequencies that can be generated by a pulsed power supply and applied to the pole piece from the magnetically enhanced CVD source.
Figure 1H:
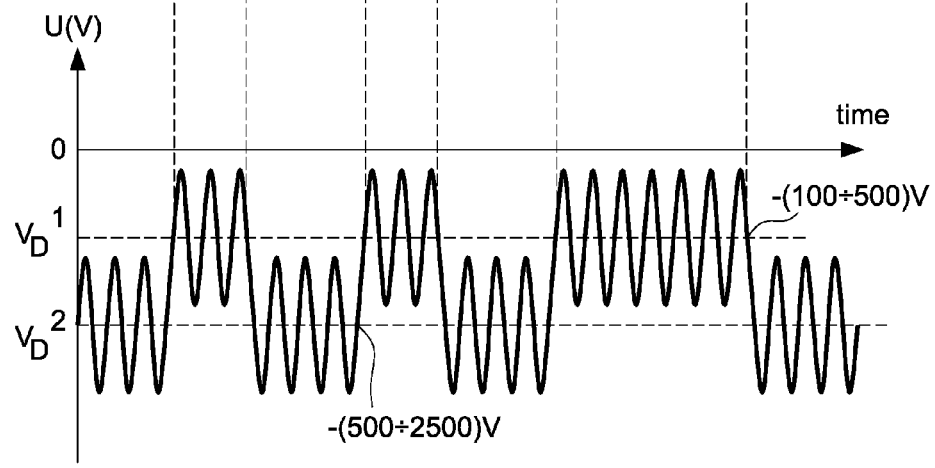
FIG. 1(h) shows a timing diagram of negative RF voltage applied to the cathode target when negative voltage pulses with different frequencies are applied to the pole piece from the magnetically enhanced CVD source.
Figure 1I:
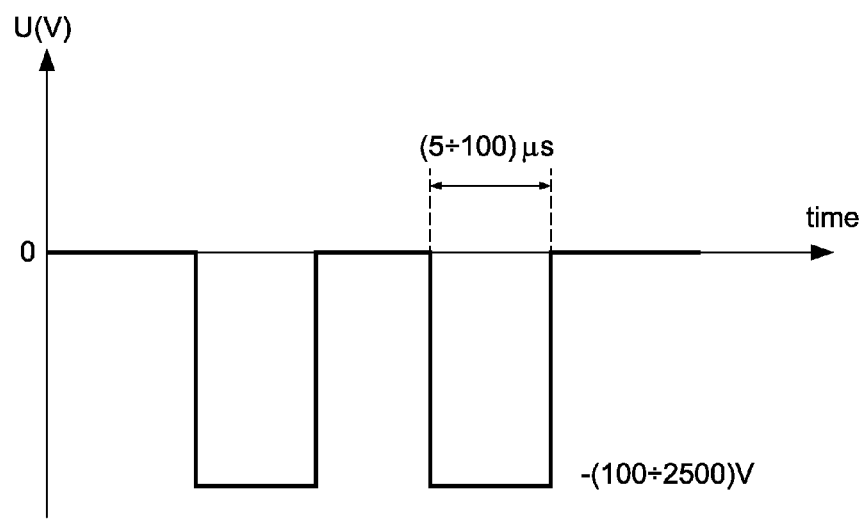
FIG. 1(i) shows a timing diagram of negative voltage pulses that can be generated by a pulsed power supply and applied to the pole piece from the magnetically enhanced CVD source.
Figure 1J:
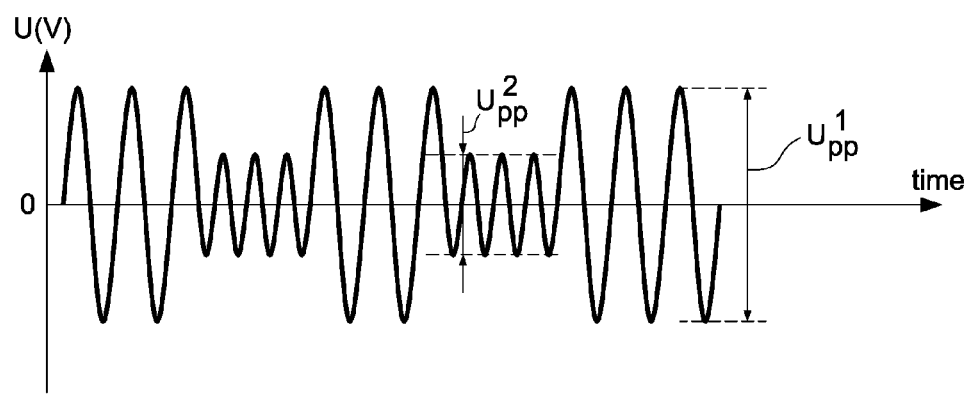
FIG. 1(j) shows a timing diagram of negative RF voltage applied to an inductively grounded cathode target when negative voltage pulses with different frequencies are applied to the pole piece from the magnetically enhanced CVD source.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

An embodiment of a magnetically enhanced CVD deposition source magnetic field geometry is shown in FIG. 1 (a). This geometry, on one side, forms a cusp magnetic field in a gap between an anode and a hollow cathode target and, on another side, forms magnetic field lines that cross a surface of the cathode substantially perpendicular to the cathode surface. Therefore, magnetic field lines from one side terminate on the cathode target surface, and from another side the magnetic field lines terminate in the gap on the pole piece that does not has the same potential as a cathode target, and the pole piece is not a cathode target. This magnetic field geometry does not confine secondary electrons near the cathode target surface, as in conventional magnetron sputtering sources. Rather, this magnetic field geometry allows secondary electrons to move from the target surface toward the gap between the cathode and the anode.

In the case of chemically enhanced ionized physical vapor deposition (CE-IPVD) when negative voltage pulses are applied to the cathode target, plasma is ignited and sustained in a reactive gas atmosphere during the voltage pulse, the magnetic field lines guide secondary electrons emitted by the cathode target surface away from the cathode surface towards the gap between the hollow cathode and anode. During this movement, the electrons dissociate the feed gas molecules, and ionize atoms. By the time these electrons come in contact with the pole piece in the gap that concentrates the cusp magnetic field in the gap, the electrons have lost a portion of their initial energy. A portion of the secondary electrons will drift back to the hollow cathode target surface due to magnetic mirror effect or presence of negative potential on the pole piece. If these electrons reach the hollow cathode surface during the time between voltage pulses, when the hollow cathode target voltage is equal to zero, these electrons discharge a positive charge on top of the cathode surface and significantly reduce or eliminate the probability of arcing on the cathode target surface during the CE-IPVD. The amount of electrons returning to the hollow cathode surface can be controlled by selecting the magnetic field geometry, gas pressure, amplitude, duration, distance between applied voltage pulses, and duration and value of negative potential on the pole piece. The positive charge on the hollow cathode target surface can be formed due to the generation of low electrical conductivity films during the CVD process.

A magnetically enhanced CVD source has a hollow cathode target and at least two rows of magnets 101 and 102 as shown in FIG. 1 (a). The two rows of magnets face each other and provide a magnetic field in the same direction (south-south or north-north) and, therefore, generate cusp magnetic field geometry 103 in the gap 113 between the hollow cathode target 104 and the anode 105 where the anode is positioned on top of the hollow cathode target 104. A pole piece 106 is disposed between two rows of the magnets 101, 102. This pole piece 106 can be made from magnetic or nonmagnetic material. If the pole piece 106 is made from magnetic material, the pole piece 106 concentrates the cusp magnetic field which can increase a magnetic mirror effect for the electrons drifting from the cathode target surface towards the gap. There is another pole piece 109 positioned on top of the top row of magnets 101. This pole piece 109 is made from magnetic material. The pole piece 109 is exposed to plasma through the gap 110 positioned in the anode 105. The pole pieces 109 and 106 can be connected to power supply 107 or can be grounded or isolated from ground.

In some embodiments, power supply 107 is an RF power supply. In some embodiments, pole piece 106 is grounded through inductor 127. Pole piece 109 can be connected to a different power supply and can have a different potential than pole piece 106. Pole pieces are isolated from the anode 106 and magnets 101 and 102 by isolators 108. Magnetic field lines from the bottom row of the magnets 102 penetrate the top surface of the hollow cathode target 104 at a substantially 90 degree angle. Magnetic field lines 112 from the top row of the magnets terminate on the magnetic pole piece 106 and 109. Magnetic field lines 111 from the bottom row of magnet 102 crosses over the magnetic pole pieces 114, 115, magnet 116, and cathode target 104. Pole pieces 114, 115 are made from magnetic material. Magnet 116 enhances the magnetic field near the cathode target surface. The cathode target 104 is connected to power supply 117. The cathode target 104 can be also connected to power supply 118 through switch 119. In some embodiments, power supply 118 is an RF power supply and power supply 117 is a DC power supply. These two power supplies 117, 118 generate an RF DC superimposed discharge. In some embodiments only RF power supply 118 is connected to the cathode target 104. In this case, a ground 125 can be connected to the cathode target 104 through inductor 124 and switch 126. If the cathode target 104 is inductively grounded, the RF discharge cannot generate a constant negative voltage bias. In this case, there is no sputtering from the cathode target 104. In some embodiments, only one power supply 117 is connected to the cathode target 104 and generates negative voltage pulses.

Magnetic field 111 lines that penetrate the hollow cathode surface guide the emitted electrons from the hollow cathode target surface 104 to the gap between the anode and the hollow cathode 104 as shown in FIG. 1 (b) by arrow 120. By the time the emitted electrons arrive at the gap, a portion of their initial energy has been lost due to dissociation, ionization, and/or elastic and/or non-elastic collisions with neutral atoms, ions, and/or other electrons. One portion of the electrons reflect from point "A" due to a magnetic mirror effect and another portion of the electrons reflect from point "B" due to the presence of a negative potential on pole piece 106. The electrons drift back from the gap towards the hollow cathode surface as shown by arrow 121. Another portion of the electrons drift towards the anode gap as shown by arrow 122. These electrons reflect back from point "C" due to the magnetic mirror effect, and from point "D" due to a negative electric potential on the pole piece as shown by arrow 123. If pole piece 109 is hidden under grounded anode 105, the portion of the electrons that were not reflected by the magnetic mirror effect are absorbed by grounded anode 110. Preferably, a negative voltage on the pole pieces 106 is less than −50 V in order to prevent possible sputtering from the pole piece. In some embodiments, short negative voltage pulses with durations in the range of 5-100 µs and amplitudes in the range of 100-2000 V with a frequency of up to about 100 kHz are applied to the pole piece 106. Voltage pulse can be triangle, rectangular, trapezoidal or have any shape. Voltage pulse can be negative, bipolar, or positive. Application of the negative high voltage pulses increase the energy of the electrons reflected from the gap 113 and, therefore, the plasma density.

FIG. 1 (c) shows negative voltage pulses generated by power supply 107 when the cathode target 104 from the CVD source is connected to the RF power supply. Pulsed negative voltage increases electron energy in RF discharge and, therefore, increases plasma density. As a result, in some embodiments, the negative voltage bias generated by RF power supply 117 is reduced during the pulse from $U_D^2$ to $U_D^1$ as shown in FIG. 1 (d). FIG. 1 (e) shows negative voltage pulses with different amplitude $U^1$-$U^3$ generated by power supply 107. Pulse voltage increases the amount of electrons and, therefore, increases the plasma density. A greater negative pulse voltage amplitude $U^3$ generates greater plasma density and, therefore, there is a less negative voltage bias $U_D^1$ generated by the RF power supply. As a result, in some embodiments, the discharge voltage generated by RF power supply 117 is reduced during the pulse as shown in FIG. 1 (f). The influences of the frequency of the negative voltage pulses generated by power supply 107 on discharge voltage generated by power supply 117 or 118 are shown in FIG. 1 (g, h). FIG. 1 (i) shows negative voltage pulses generated by power supply 107. As a result, in some embodiments, the peak-to-peak voltage $U_{pp}^1$ generated by RF power supply 117 connected to the inductively grounded cathode target 104 is reduced during the pulse $U_{pp}^2$ as shown in FIG. 1 (j). Depending on the voltage amplitude, duration, and shape of the voltage pulses applied to the cathode, the voltage applied to the pole piece 106, 109, and gas pressure, the electrons will move back and forth between the cathode target and the gaps.

Figure 2A:
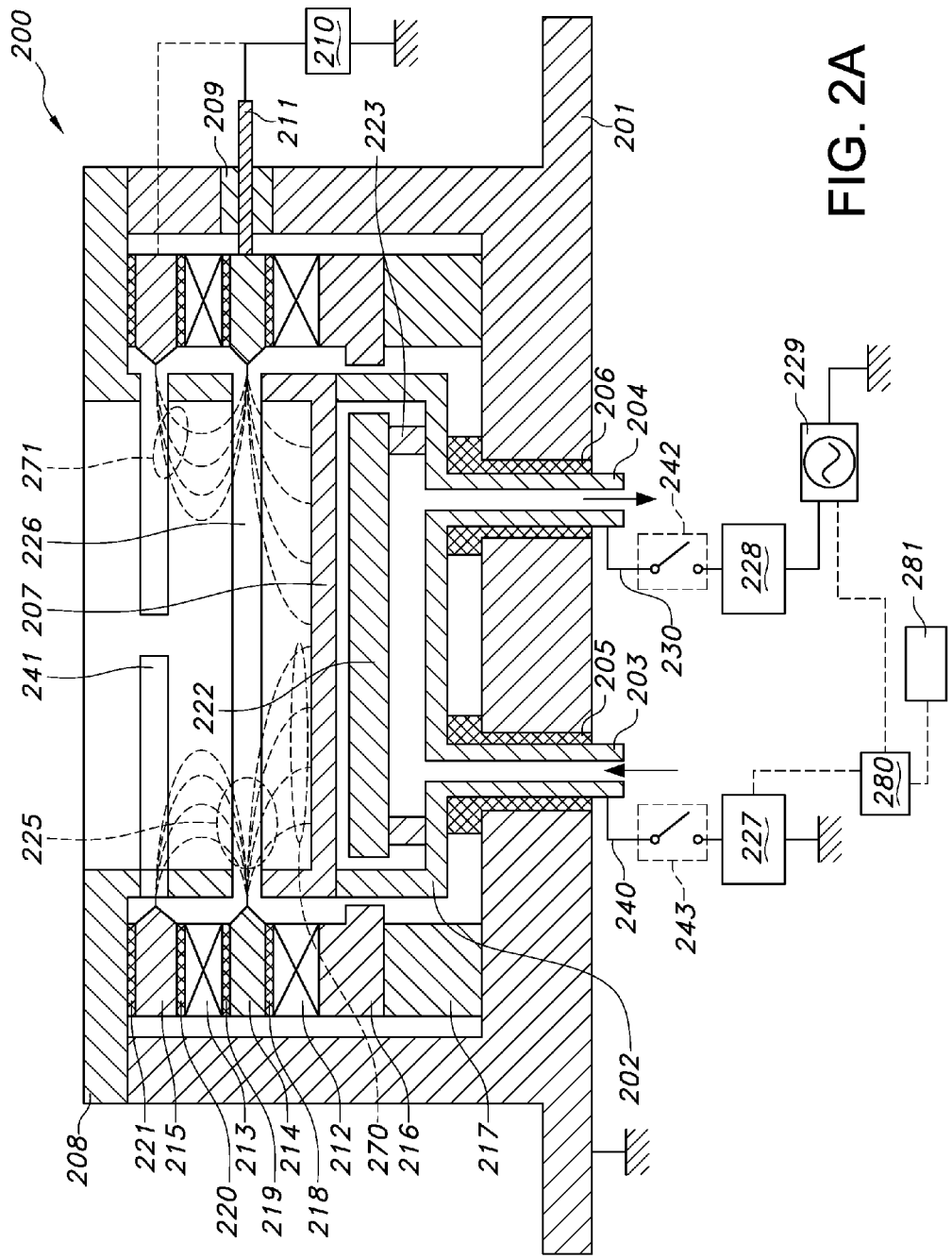
FIG. 2(a) shows an illustrative cross-sectional view of an embodiment of the magnetically enhanced CVD source.
Figure 2B:
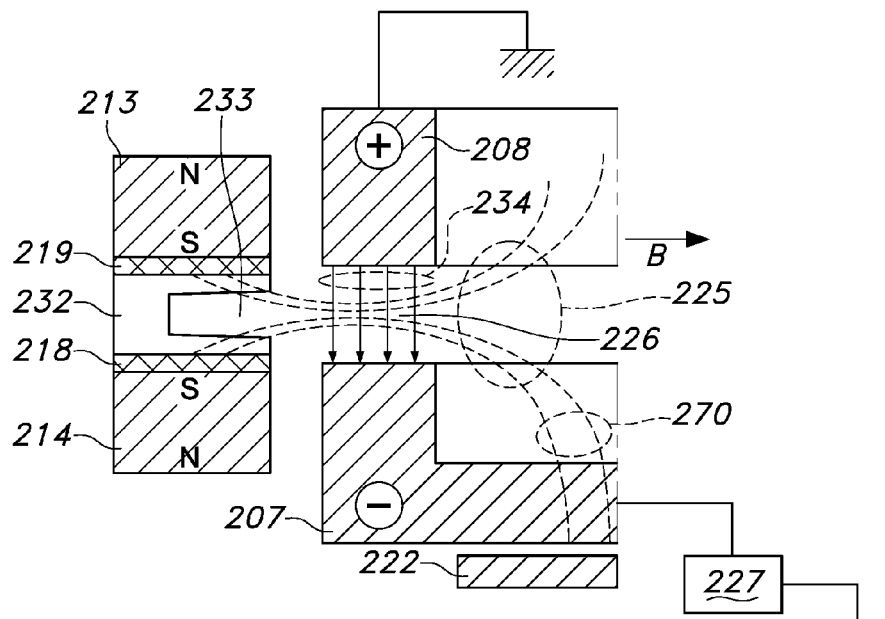
FIG. 2(b) shows an illustrative cross-sectional view of a gap between the cathode and the anode of the magnetically enhanced CVD source with a pole piece made from non-magnetic material.
Figure 2C:
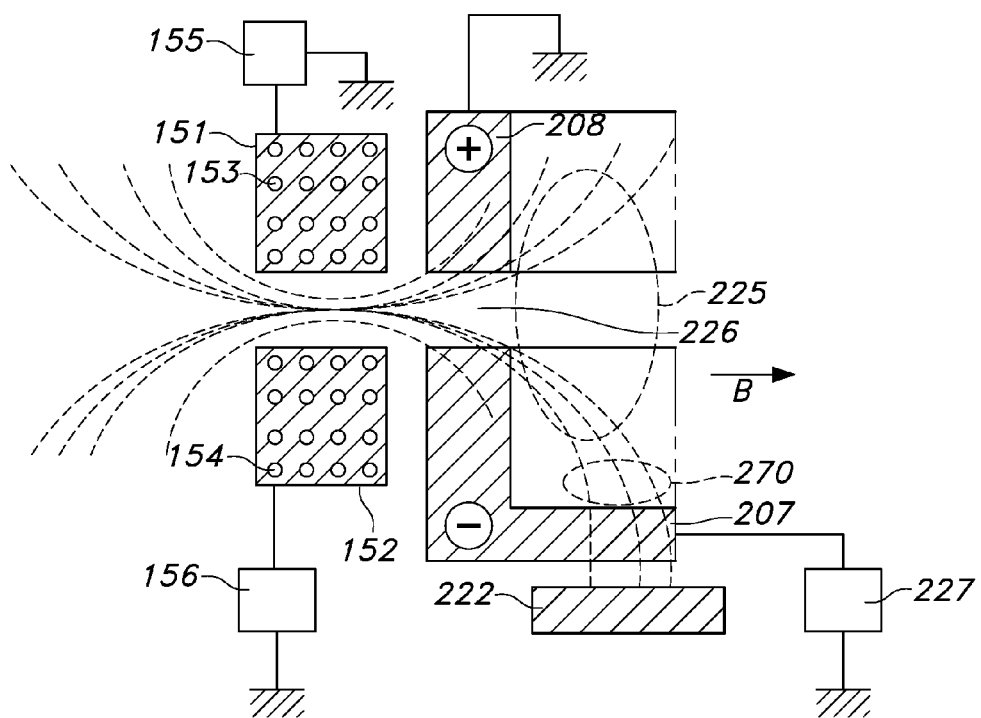
FIG. 2(c) shows an illustrative cross-sectional view of a gap between the cathode and the anode of the magnetically enhanced CVD source when magnets that form cusp magnetic field are electromagnets.

FIG. 2 (a) shows a cross-sectional view of an embodiment of the magnetically enhanced CVD deposition source 200. The magnetically enhanced CVD deposition source 200 includes a base plate 201. The base plate has an electrical ground potential. The cathode assembly includes a water jacket 202 and a hollow cathode target 207. The water jacket 202 is electrically isolated from the base plate 201 with isolators 205 and 206. Water or another fluid for cooling can move inside the water jacket 202 through inlet 203 and can move outside the water jacket 202 through outlet 204. The hollow cathode target 207 is positioned on top of water jacket 202. The hollow cathode target 207 is electrically connected to a negative terminal of a power supply 227 through a water inlet 203, transmission line 230, and switch 243. The power supply 227 can include a direct current (DC) power supply, a pulsed DC power supply that generates unipolar negative voltage pulses, a pulsed DC power supply that generates an asymmetrical bipolar voltage pulses, a pulsed DC power supply that generates symmetrical bipolar voltage pulses, an RF power supply, and/or a high power pulsed power supply. Any of these pulsed power supplies can generate different shapes, frequencies, and amplitudes of the voltage pulses. These power supplies can work in power control mode, voltage control mode, or in current control mode. The water inlet 204 is electrically connected to a negative terminal of a power supply 229 through a transmission line 230, matching network 228, and switch 242. A power supply 229 can include a radio frequency (RF) power supply, pulsed RF power supply, high frequency (HF) power supply, pulsed HF power supply, or any combination of these power supplies. The frequency of the applied power can be in the range of 100 kHz-100 MHz. Power supply 227 can operate together with power supply 229 or can operate alone without connecting power supply 229 to the cathode assembly. Power supply 229 can operate together with power supply 227 or can operate alone without connecting power supply 227 to the cathode assembly. The cathode 207 can be powered with any combination of the power supplies mentioned above. All of the above-mentioned power supplies can operate in current control mode, voltage control mode, and/or power control mode. Power supply 227 and power supply 229 can be connected to the same water inlet 203. The cathode target 207 is formed in the shape of a round hollow shape, but can be formed in other shapes, such as a rectangular hollow shape, disc, and the like. The cathode target 207 material can be conductive, semi-conductive, and/or non-conductive. The following chemical elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases $O_2$, $N_2$, F, Cl, and/or $H_2$ can also be used as a cathode material. Power supplies 227, 228, and switches 243, 242 are connected to the controller 280 and computer 281. Controller 280 and/or computer 281 control the output voltage values and timing of the power supplies 227 and 229. The power supplies 227 and 229 can be synchronized.

The cathode assembly includes a stationary cathode magnetic assembly 222 positioned inside the water jacket 202. The cathode magnetic assembly 222 in an embodiment includes a disc-shaped magnetic pole piece made from magnetic material, such as iron. The magnetic assembly 222 is mounted on the plate 223 that is made from non-magnetic material. The presence of the magnetic pole piece 222 provides for a perpendicular direction of the magnetic field lines to the surface of the cathode. In an embodiment, the cathode magnetic assembly (stationary or rotatable) includes a plurality of permanent magnets and magnetic pole pieces. The shape of the magnetic assembly 222 determines the angle between the magnetic field lines and a surface of the cathode. In an embodiment, the magnetic assembly 222 is rotatable. In an embodiment, the magnetic assembly 105 is kidney-shaped. The magnetic assembly 222 can rotate with a speed in the range of 1-500 revolutions per minute.

A ring-shaped anode 208 is positioned proximate to the cathode target 207. The anode 208 and a hollow cathode target 207 form a circular gap 226. The electric field lines are perpendicular to the magnetic field lines in the gap. Magnetic field lines 270 are substantially perpendicular to the cathode target surface. In some embodiments, a top part of the anode 208 has a feed gas chamber and a gas outlet. In some embodiments, a feed gas is fed through the gas pipe to the chamber and is uniformly applied through the holes in the feed gas chamber. In some embodiments, a feed gas is fed through the gap between the hollow cathode target and the anode.

A magnet assembly that generates a cusp magnetic field 225 has a round shape and is positioned behind the ring-shaped anode 208 and hollow cathode target 207. The magnetic assembly includes magnetic ring-shaped pole pieces 216, 214, 215 and a plurality of permanents magnets 213, 212. The magnets 213, 212 are positioned inside the magnet housing (not shown in FIG. 2(a)). The magnets 212, 213 face each other in the same direction in order to generate a cusp magnetic field 225 in the gap 226. The value of the magnetic field caused by the permanents magnets 212, 213 is in a range of 100-10000 G. Magnetic pole pieces 216, 214, 215, and 222 with magnets 213, 212 generate cusp magnetic field 225. The pole piece 216 is mounted on top of the support 217.

Power supplies 227, 229 are connected to the controller 280. Controller 280 can be connected to a computer 281. Controller 280, 281 control the output voltage signals from the power supplies 227, 229.

The pole piece 214 is electrically isolated from the magnet 212 by isolator 218. The pole piece 214 is electrically isolated from the magnet 213 by isolator 219. The pole piece 215 is electrically isolated from the magnet 213 by isolator 220. The pole piece 215 is electrically isolated from the anode 208 by isolator 221.

The magnetic fields 225 are shaped to provide electron movement between the cathode target 207 and pole pieces 214, 215. During this movement, electrons ionize feed gas molecules and/or atoms and sputtered target material atoms.

Electrons that are generated through ionization of the feed gas are trapped in the magnetic fields 225.

The pole pieces 215, 214 may have a different design. The portion of the pole piece that is exposed to the gap 226 has a cut 233 in the middle as shown in FIG. 2 (*b*). The pole piece 232 is made from non-magnetic material. The shape and material of the pole piece has an effect on point of reflections "B" and "A" as shown in FIG. 1 (*b*).

Pole piece 214 is connected to voltage control mode power supply 210 through electrode 211. Electrode 211 is isolated from the base plate 201 with isolator 209. In some embodiments, power supply 210 is an RF power supply. In some embodiments, pole piece 219 is grounded through an inductor.

In an embodiment, the magnets 213, 212 are electromagnets as shown in FIG. 2 (*c*). Rather than using permanent magnets 213, 212 to generate magnetic field 225, 270, coils 151, 152 can be used to generate cusp magnetic field 225 and magnetic field 270. Electric current in the coils 151, 152 has a different direction in order to form a cusp magnetic field. The value of the magnetic field 225 will depend on the electrical current value from the power supplies 155, 156 and the quantity of wire turns 153, 154 in the coils. The power supplies 155, 156 can release pulsed electrical current or continuous electrical current. Pulsed electrical currents generate a pulsed magnetic field 225, and continuous electrical current generates a continuous magnetic field 225. The magnetic field value 225 can be in the range of 500-10000 G. Power supplies 156, 155 can be connected to controller 280 and computer 281.

Figure 3:
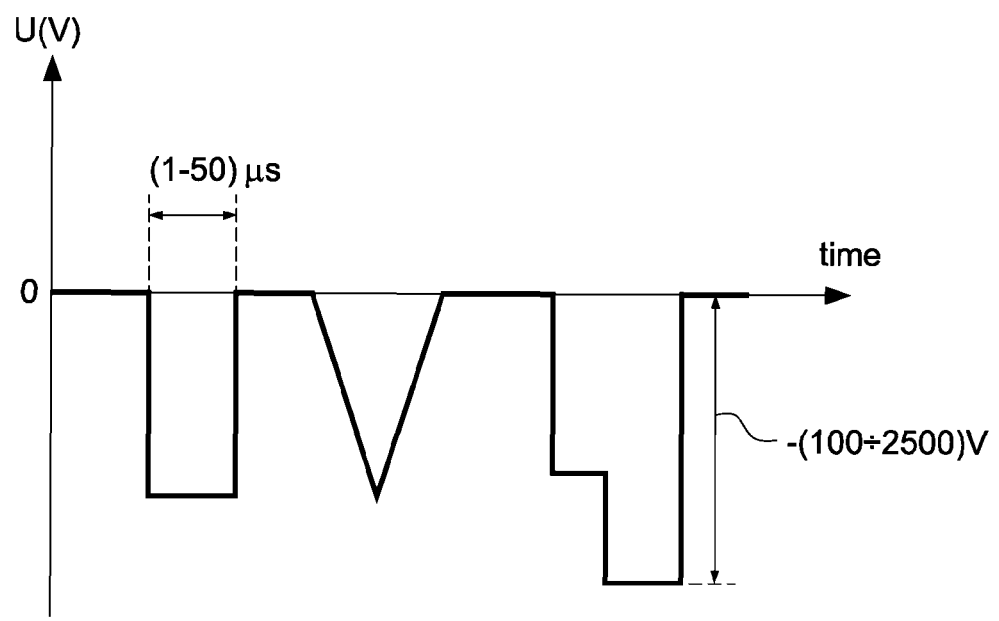
FIG. 3 shows a timing diagram of negative voltage pulses that can be generated by a pulsed power supply and applied to the pole piece.
Figure 4A:
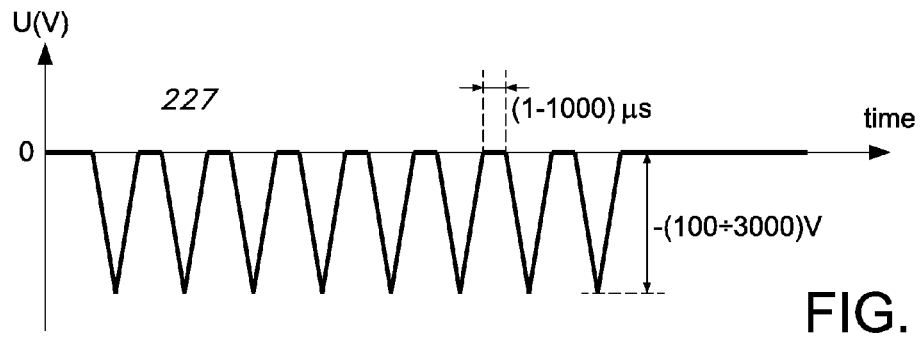
FIG. 4(a, b, c, d) show timing diagrams of the negative voltage pulses that can be generated by a pulsed power supply and applied to the cathode assembly.
Figure 4B:
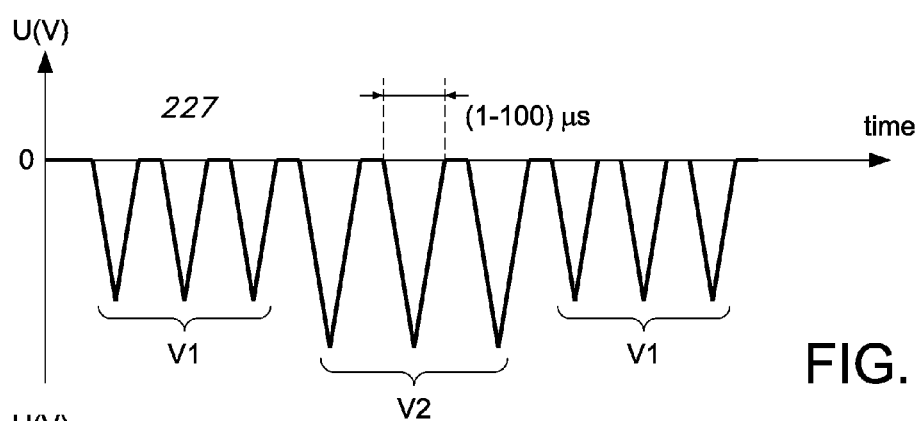
Figure 4C:
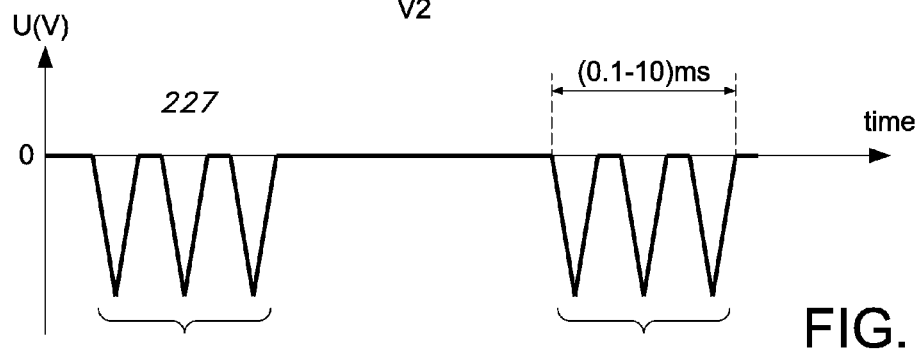
Figure 4D:
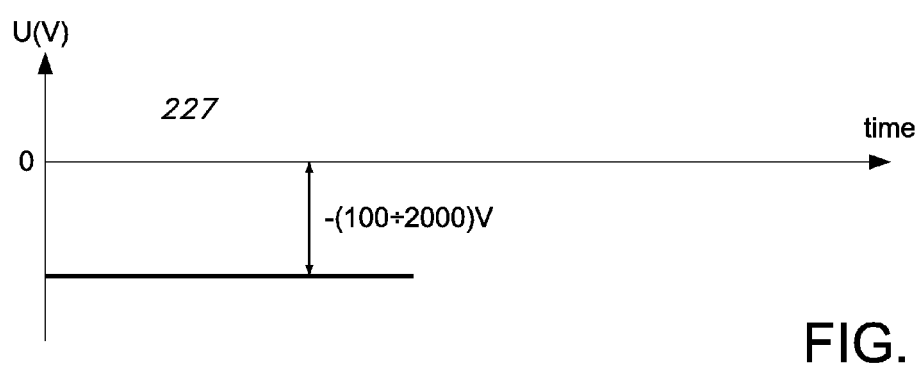
Figure 5A:
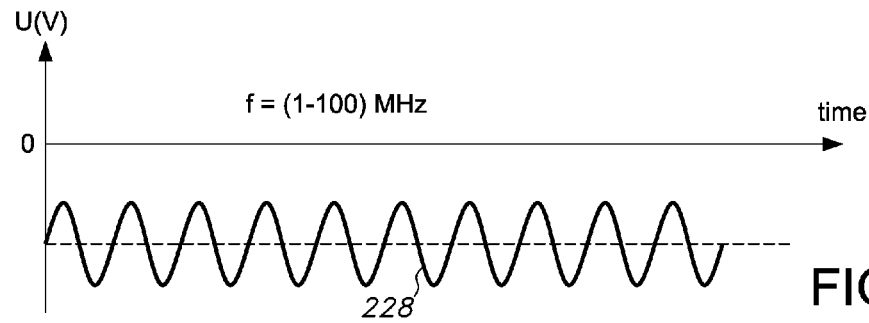
FIG. 5(a, b, c, d) show timing diagrams of RF voltages that can be applied to the cathode assembly.
Figure 5B:
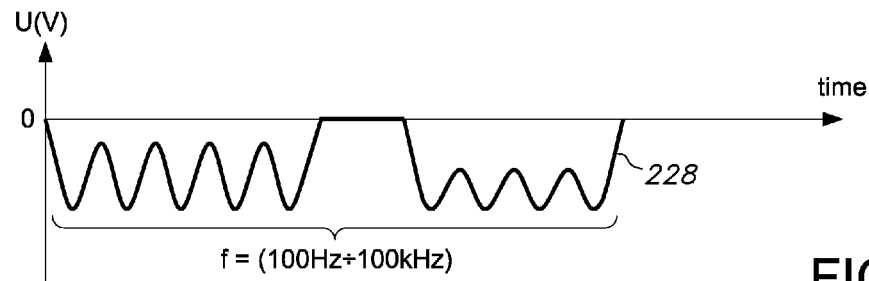
Figure 5C:
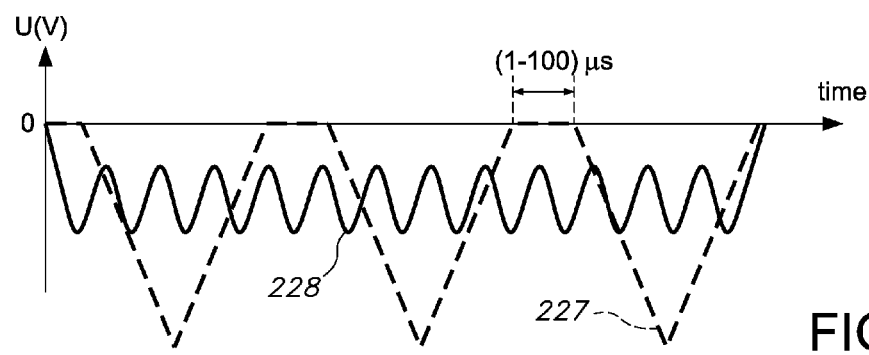
Figure 5D:
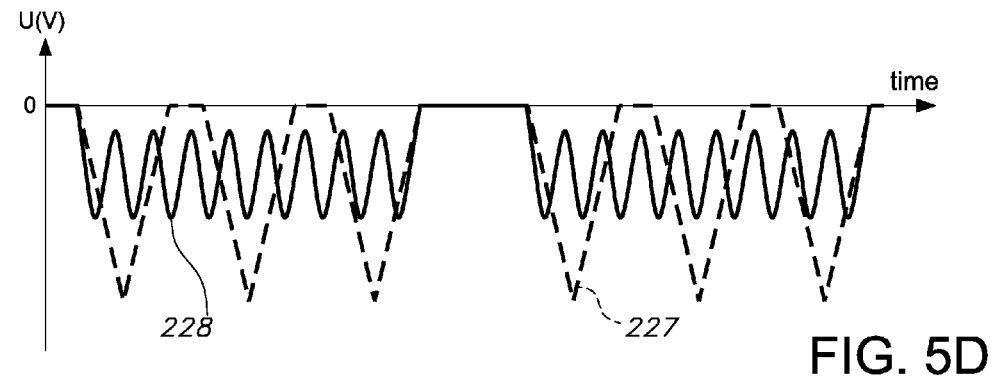
Figure 6A:
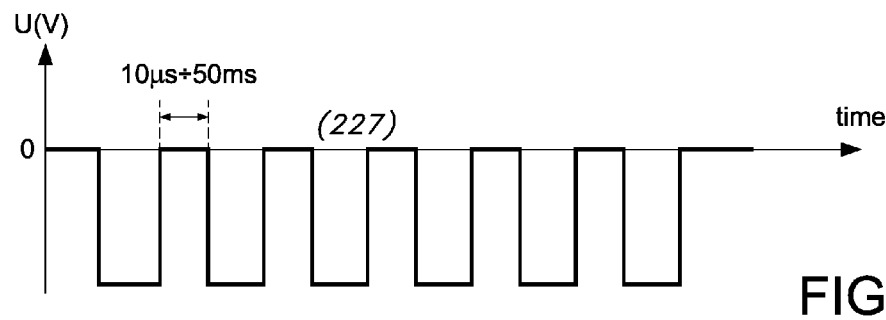
FIG. 6(a, b, c, d, e) show timing diagrams of different shapes of voltage pulses that can be applied to the cathode assembly.
Figure 6B:
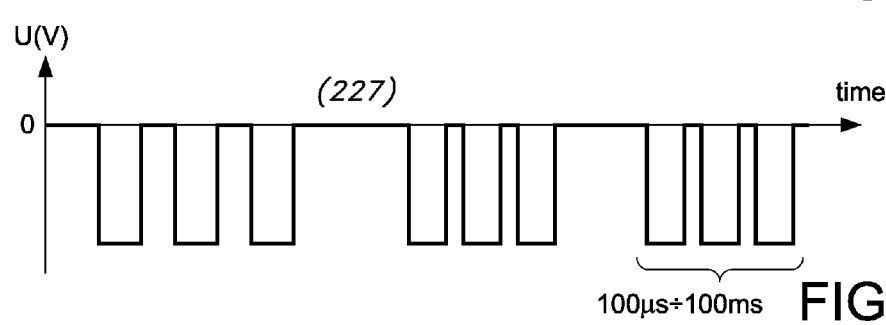
Figure 6C:
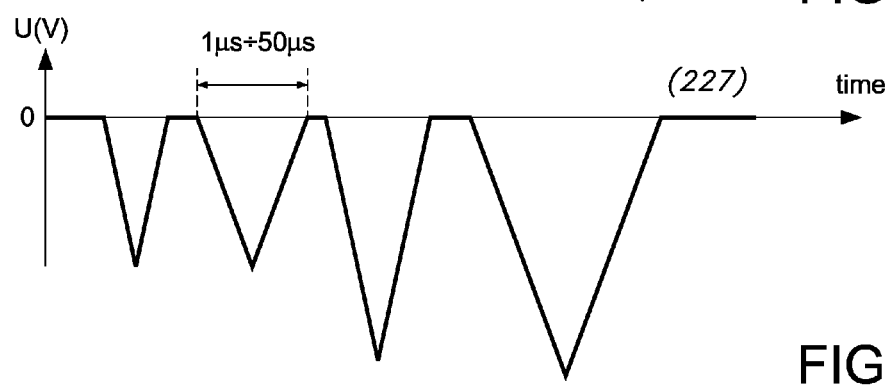
Figure 6D:
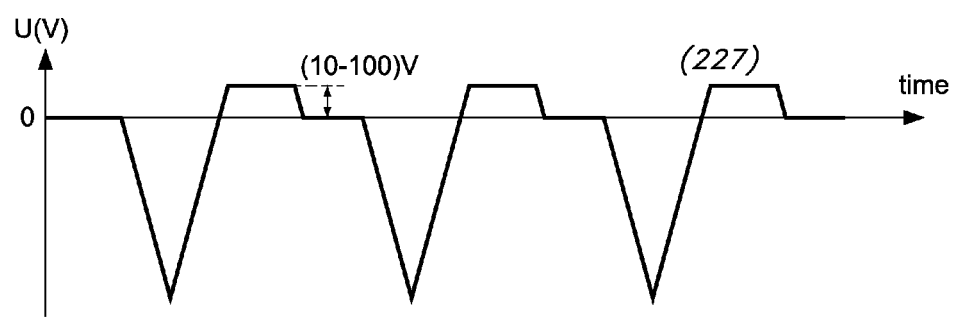
Figure 6E:
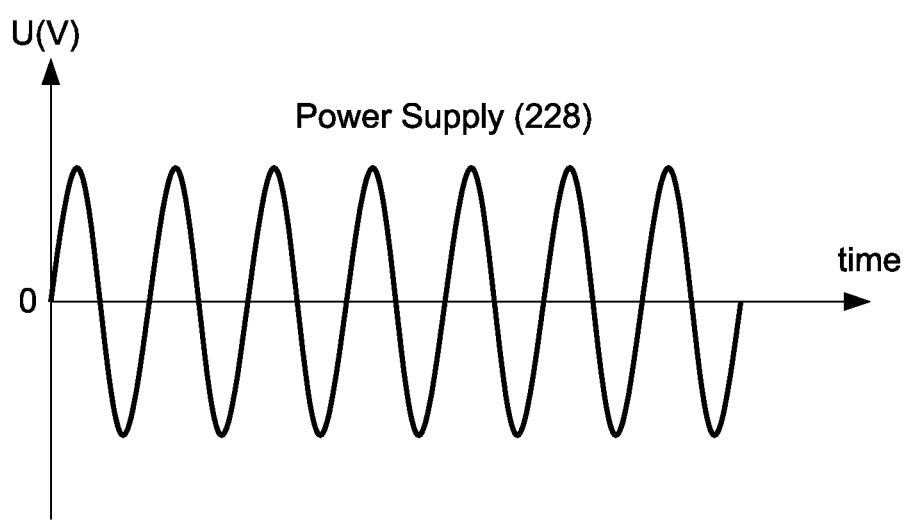

FIG. 3 shows voltage pulse shapes that can be generated by power supply 210. The amplitude of negative voltage pulses can be in the range of 100 and 2500 V. The pulse duration can be in the range of 1-50 μs.

FIGS. 4 (*a, b, c, d*) show different voltage pulse shapes, amplitudes, and frequencies that power supply 227 can provide. Typically, in order to generate and sustain volume discharge, the power supply 227 operates in power control mode or in voltage control mode. FIG. 4 (*a*) shows a continuous train of triangular negative voltage pulses. The amplitude can be in the range of 100-3000 V. FIG. 4 (*b*) shows a train of negative voltage pulses that has different voltage amplitudes. The voltage pulses with amplitude V1 can be optimized to increase the dissociation rate of feed gas molecules, and voltage pulses with amplitude V2 can be optimized to increase the ionization rate of the target material atoms and particular carbon atoms. The pulse voltage provides energy to the electrons in the plasma discharge. For example, voltage V1 is optimized to increase a dissociation rate of gas molecules containing carbon atoms such as $C_2H_2$, $CH_4$, CO, $CO_2$, $C_3H_8$, $CH_3OH$, $C_2H_5OH$, $CH_3Cl$, and the like. Also, it is important to increase the dissociation rate of $H_2$ ($H_2+e \rightarrow H_2^*+e \rightarrow H+H+e$). The high-voltage pulse amplitude V2 provides more energy to the electrons. Electrons collide with gas molecules, gas atoms, and target material atoms. Typically, gas atoms need more energy in order to be ionized and molecules need less energy to dissociate. That is, if the voltage amplitude is high then the probability of ionization of atoms will be high. The pulse duration can be in the range of 1 microsecond-1 millisecond. FIG. 4 (*c*) shows a pulse train of triangular negative voltage pulses. The duration of the train of negative voltage pulses can be in the range of 100 microseconds-10 milliseconds. The frequency of the train of negative voltage pulses can be in the range of 100 Hz and 20 KHz. FIG. 4 (*d*) shows a continuous voltage that can be in the range of −100 and −2000 V.

FIG. 5 (*a*) and FIG. 5 (*b*) show continuous and pulsed RF voltages, respectively, that can be provided by power supply 228. The RF power can be in the range of 100 W-10 kW. The RF frequency can be in the range of 100 kHz-100 MHz. The frequency of RF pulses can be in the range of 100 Hz-100 kHz. FIG. 5 (*c*) shows voltage on the cathode when power supply 227 provides a continuous train of triangle voltage pulses and power supply 228 simultaneously provides continuous RF voltage. FIG. 5(*d*) shows voltage on the cathode when power supply 227 provides a pulse train of triangular voltage pulses and power supply 228 simultaneously provides pulse RF voltage. Power supply 227 can generate a continuous train of rectangular negative voltage pulses as shown in FIG. 6 (*a*). Power supply 227 can generate a pulse train of rectangular negative voltage pulses as shown in FIG. 6 (*b*). FIG. 6 (*c*) shows different voltage pulse shapes in one pulse train. FIG. 6 (*d*) shows a train of asymmetric bi-polar voltage pulses when the negative pulse voltage has triangular shape. FIG. 6 (*e*) shows continuous and pulsed RF voltages that can be provided by power supply 228 or 227 to the inductively grounded cathode target 207.

Figure 7:
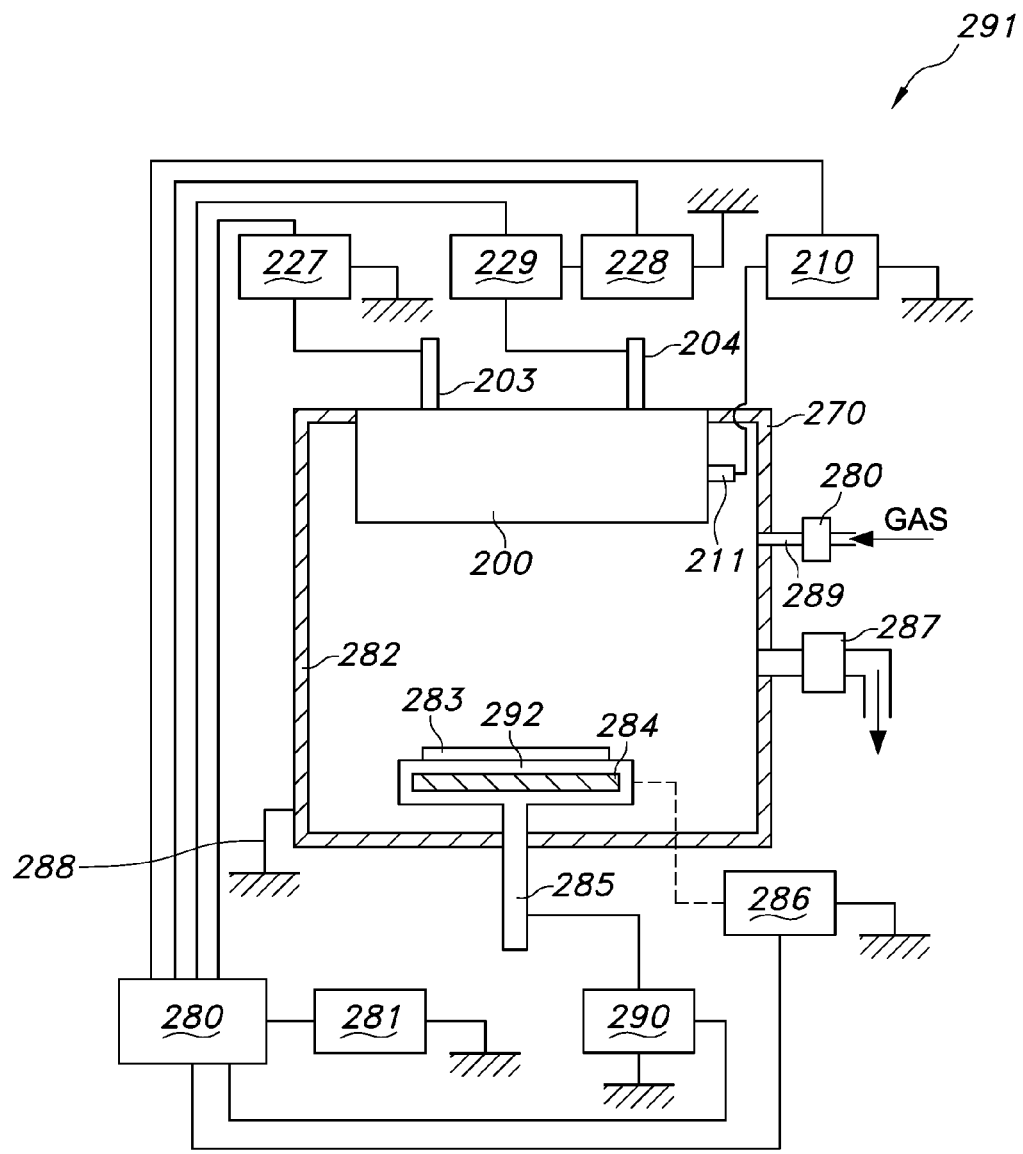
FIG. 7 shows an illustrative cross-sectional view of an embodiment of the magnetically enhanced CVD apparatus for thin film deposition on a round substrate, such as a Si substrate.

The magnetically enhanced CVD deposition source 200 can be mounted inside the vacuum chamber 270 in order to construct the magnetically enhanced HDP-PVD deposition apparatus 291 as shown in FIG. 7 (*a*). The vacuum chamber 270 contains feed gas and plasma. The vacuum chamber 270 is coupled to ground 288. The vacuum chamber 270 is positioned in fluid communication with a vacuum pump 287, which can evacuate the feed gas from the vacuum chamber 270. Typical baseline pressure in the vacuum chamber 270 is in a range of $10^{-5}$-$10^{-9}$ Torr.

A feed gas is introduced into the vacuum chamber 270 through a gas inlet 289 from feed gas sources. A mass flow controller 280 controls gas flow to the vacuum chamber 270. In an embodiment, vacuum chamber 270 has many gas inlets and mass flow controllers. The gas flow can be in a range of 1-1000 SCCM depending on plasma operating conditions, pumping speed of the vacuum pump 287, process conditions, and the like. In some embodiments, the feed gas is introduced through the gap 226 from the magnetically enhanced CVD source. Typical gas pressure in the vacuum chamber 201 during a CVD process is in a range of 0.1 mTorr-50 Torr. In an embodiment, a plurality of gas inlets and a plurality of mass flow controllers sustain a desired gas pressure during the CVD process. The plurality of gas inlets and plurality of mass flow controllers may be positioned in the vacuum chamber 270 at different locations. The feed gas can be a noble gas, such as Ar, Ne, Kr, Xe; a reactive gas, such as $N_2$, $O_2$; any other gas that is suitable for CVD processes. For depositing DLC or diamond films, the feed gas contains atoms of carbon. For example, the cathode target material is carbon. The feed gas can be $C_2H_2$, or $CH_4$ or any other gases/vapors contains carbon atoms, such as CO, $CO_2$, $C_3H_8$, $CH_3OH$, $C_2H_5OH$, and/or $CH_3Cl$. Feed gas can also be a mixture of different of gases. In some embodiments, the cathode target material is not a carbon. The CVD source is connected to power supply 227 through water inlet 203, and power supply 229 is connected to water outlet 204. In some embodiments, only power supply 227 is connected to the CVD source. In some embodiments, only power supply 228 is connected to the CVD source.

The magnetically enhanced CVD apparatus 291 includes a substrate holder 292 that holds a substrate 283 or other work piece for plasma processing. The substrate support 284 is electrically connected to bias voltage power supply 290 through the connector 285. The bias voltage power supply 290 can include a radio frequency (RF) power supply, alternating current (AC) power supply, very high frequency (VHF) power supply, and/or direct current (DC) power supply. The bias power supply 290 can operate in continuous mode or in pulse mode. Pulse substrate bias voltage can be synchronized with pulse voltage applied to the cathode target. The bias power supply 290 can be a combination of different power supplies that can provide different frequencies. The negative bias voltage on the substrate can be in a range of −1 and −2000 V. The negative substrate bias voltage can attract positive ions to the substrate. In some embodiments, substrate holder 285 is inductively grounded and connected to RF power supply. During the operation, there is no negative constant bias. There are only RF voltage oscillations on the surface of the substrate that promote dissociation of the carbon containing gas. The substrate support 284 can include a heater 284 connected to a temperature controller 286 (exact connection is not shown). The temperature controller 284 regulates the temperature of the substrate 283. In an embodiment, the temperature controller 286 controls the temperature of the substrate 283 to be in a range of −20 C to +1500 C.

An additional magnet assembly between the CVD source and substrate 283 can be positioned inside the vacuum chamber 270 or outside the vacuum chamber 270 in order to increase plasma density near the substrate and, therefore, increase the dissociation rate of the gas molecules and improve film uniformity on the substrate.

Figure 8:
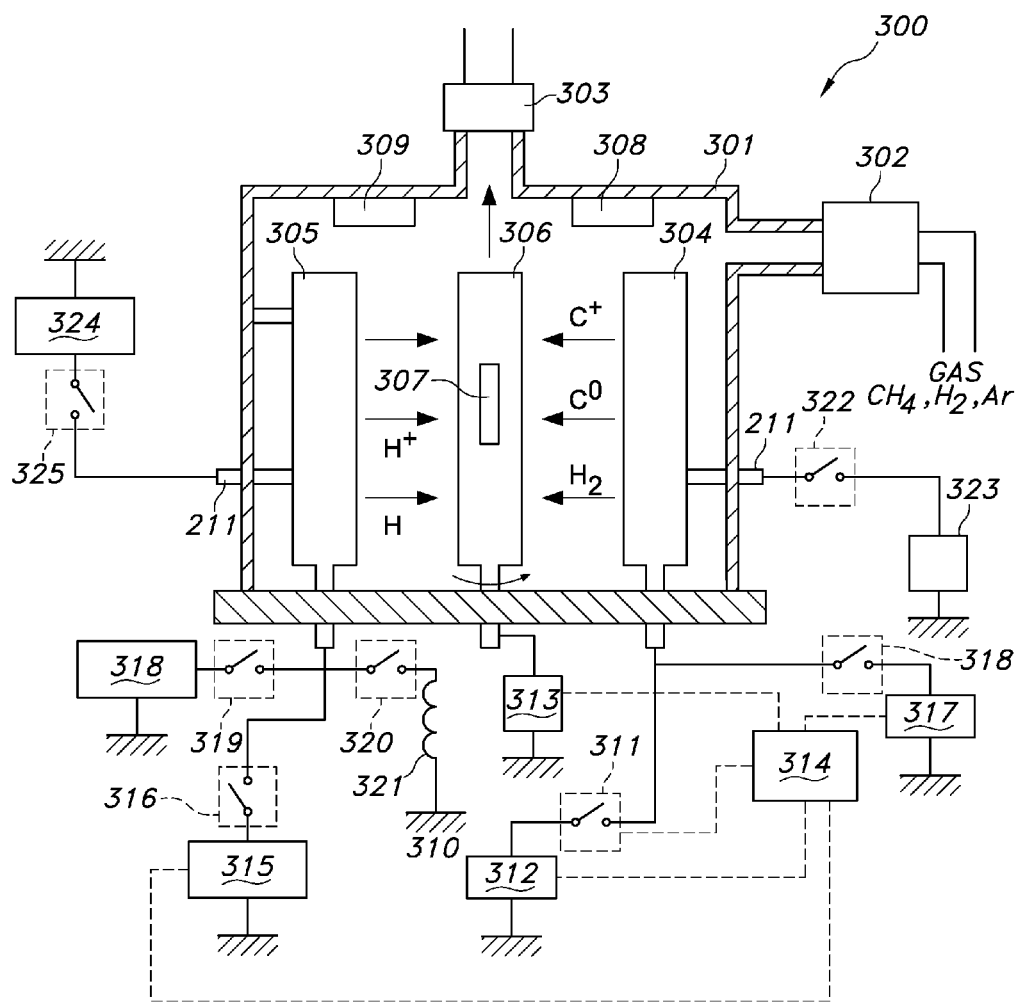
FIG. 8 shows an illustrative cross-sectional view of an embodiment of the magnetically enhanced CVD system that has two rectangular CVD sources.

The magnetically enhanced CVD source can be positioned in the vacuum chamber 301 as shown in FIG. 8. Two rectangular magnetically enhanced CVD sources 304, 305 are positioned inside the vacuum chamber 301. Vacuum pump 302 can provide base pressure up to $10^{-8}$ Torr. Two heaters 308, 309 control temperature of the sample 307. Two rectangular magnetically enhanced CVD sources 304, 305 are connected to the power supply 312, 315. The magnetically enhanced CVD source 305 is connected to RF power supply 318 through the switch 319 and is connected to ground through inductor 321 and switch 320. The pole piece 214 from the magnetically enhanced CVD source 305 is connected to power supply 324 through switch 325. The pole piece 214 from the CVD source 304 is connected to power supply 323 through switch 322. Substrate holder 306 is connected to bias power supply 313. Bias power supply 313, power supplies 312, 315, and switches 316, 310, 318 are connected with controller 314. Power supplies 316, 312 can provide any voltage pulses in any order as shown in FIGS. 4 (a, b, c, d), FIGS. 5 (a, b, c, d), and FIGS. 6(a, b, c, d, e). Bias power supply 313 can be RF power supply with frequency is in the range of 500 kHz and 30 MHz. Bias power supply 313 can be DC power supply or pulse DC power supply.

The substrate support 306 can provide for rotation of the substrate 307. The substrate support 306 can have different parts that rotate at different speeds. The substrate support 306 can hold one or more substrates 307 or work pieces.

In an embodiment, the substrate 307 is a part of automobile engine and the coating is a hydrogenated diamond-like coating (DLC). The DLC coating reduces the coefficient of friction of moving parts in the automobile engine. The thickness of the DLC coating is in a range of 0.1-10 mkm depending on the particular engine part. The parts that can be coated include the turbocharger, valve, piston, piston ring, piston pin, heat exchanger, connecting rod, crank end bearing, bearing, ball from any bearing, after cooler, intercooler, rocker arm, injector, valve guide, push rod, camshaft, fuel injection pump, oil pump, or any other part associated with the automobile engine.

The method of CVD depositing a film on the substrate includes the following steps. A first step is cleaning the surface of the substrate by a sputter etch process with a noble gas. In this step, the feed gas will be a noble gas, such as Ar. The gas pressure can be in the range of 1-20 mTorr. The substrate bias can be between −300 V and −1000 V. Magnetically enhanced CVD source 305 operates in sputter etch mode. In this mode, only RF power supply 318 is connected to the cathode target from magnetically enhanced CVD source 305. The cathode target of the CVD source 305 is inductively grounded in order to prevent sputtering from the cathode target. Power supply 324 generates voltage pulses with amplitude, duration, and frequency to provide optimum energy in the range of 150 eV to the electrons to generate Ar ions. In an embodiment, power supply 313 is RF power supply. In an embodiment, power supply 324 is not connected with pole piece 214. In this case, the RF power supply 315 generates enough power to generate significant amount of Ar ions. In some embodiments, power supply 324 is an RF power supply. In some embodiments, pole piece 214 is grounded through an inductor.

A second step is RIE (reactive ion etch cleaning) cleaning the surface of the substrate by a reactive gas, such as $O_2$, $H_2$. In some embodiments, the cleaning is made using $H_2$. In this step, the feed gas is a reactive gas. The gas pressure can be in the range of 1 mTorr-100 mTorr. The substrate bias can be between −100 V and −1000 V. Magnetically enhanced CVD sources 305 operate in RIE mode. In this mode, only RF power supply 318 is connected to CVD source 305. The cathode target from the magnetically enhanced CVD source 305 is inductively grounded. Power supply 312 generates RF discharge. Power supply 324 generates voltage pulses with amplitude, duration, and frequency to provide optimum energy in the range of 150 eV to the electrons to generate reactive gas ions. In an embodiment, the bias power supply 313 is an RF power supply. The voltage oscillation duration can be in the range of 3-50 μs. For example, the amplitude of the voltage oscillations in order to increase ionization rate of gas atoms can be in the range of 300 to 1000 V. The voltage oscillation duration can be in the range of 3-8 microseconds. In an embodiment, only the RF power supply 312 operates and the RF power level is optimized by adjusting output power to provide an optimum amount of energy for the electrons in order to provide a maximum probability to generate atomic hydrogen when electrons collide with hydrogen molecules. In an embodiment, power supplies 312, 313 operate simultaneously to generate atomic hydrogen. The third step is CVD film deposition. In this case, any gas that includes carbon atoms, such as acetylene, methane, and the like can be used. The substrate temperature is in the range of 400 C.

In an embodiment, the work piece is a part of a jet engine, and the coating can be hydrogenated DLC, or hydrogenated metal-doped DLC.

Figure 9:
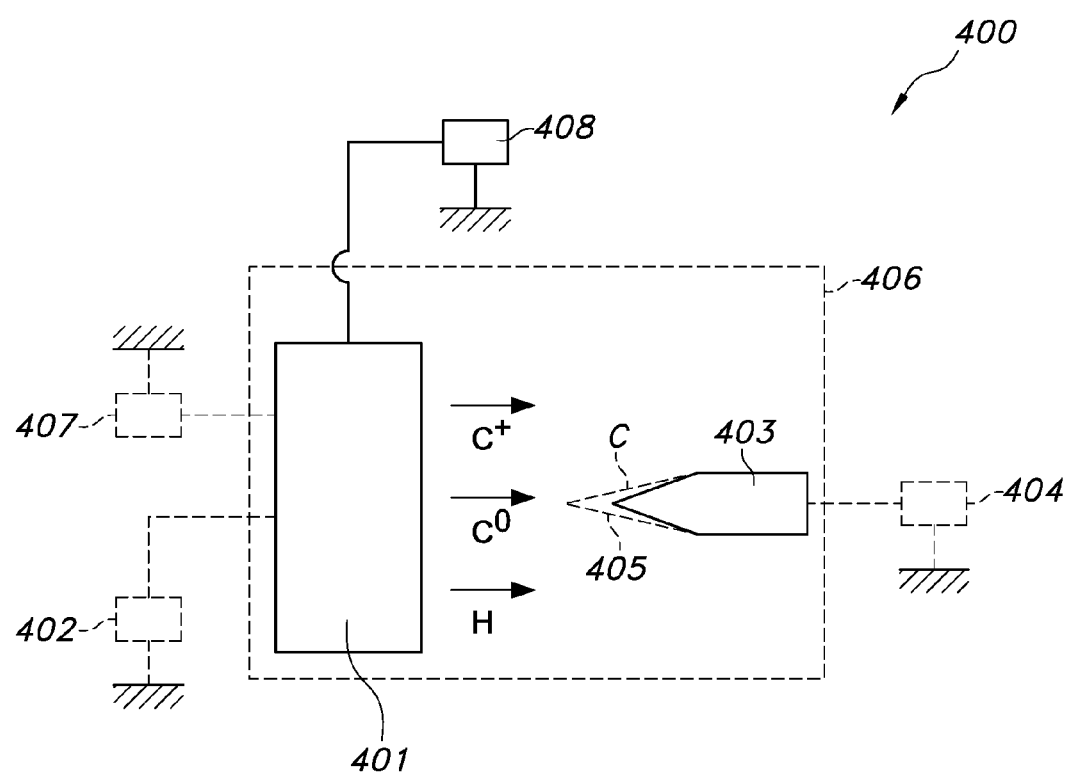
FIG. 9 shows an illustrative cross-sectional view of an embodiment of the magnetically enhanced CVD source and processes for applying a coating on a razor blade tip.

In an embodiment, the magnetically enhanced CVD source can be used to form hard DLC coating on the tip of the razor blade, as shown in FIG. 9. A blade 403 and magnetically enhanced CVD source 401 are positioned inside the vacuum chamber 406. A feed gas, such as Ar, $C_2H_2$, $CH_4$, or any other gas that contains carbon atoms is used for the CVD process. Power supplies 402 and/or 407 release negative voltage pulses on the cathode target 207 from the magnetically enhanced CVD source. Power supply 402 and/or 407 control voltage amplitude, pulse duration, and frequency. The parameters of the voltage pulses are shown in FIGS. 4(a, b, c, d), FIGS. 5 (a, b, c, d), FIGS. 6 (a, b, c, d). Power supply 404 provides negative bias voltage on the blade in the range of −20 V to −200V. Power supply 408 is connected to pole piece 214. Power supply provides voltage pulses in order to increase electron energy and increase ionization degree of carbon atoms. The voltage pulse shapes and frequency are optimized in order to get DLC film with a hardness in the range of 20-50 GPa. Typical voltage pulse amplitude will be in the range of 1000-2000 V in order to obtain film hardness in the range of 30 GPa. In some embodiments, cathode target 207 is inductively grounded. In some embodiments, pole piece 214 is inductively grounded.

The magnetically enhanced CVD source can be used for many different applications. The application of diamond and DLC coatings deposited with the CVD source includes but is not limited to smart phones, tablets, flat panel displays, hard drives, read/write heads, hair removal, optical filters, watches, valves, facets, thin film batteries, disks, microelectronics, hard masks, transistors, and/or manufacturing mono and poly crystal substrates.

The magnetically enhanced CVD source can be used for sputtering applications and can be used for chemically enhanced ionized vapor deposition. The magnetically enhanced CVD source can be configured as an Arc source.

Figure 10:
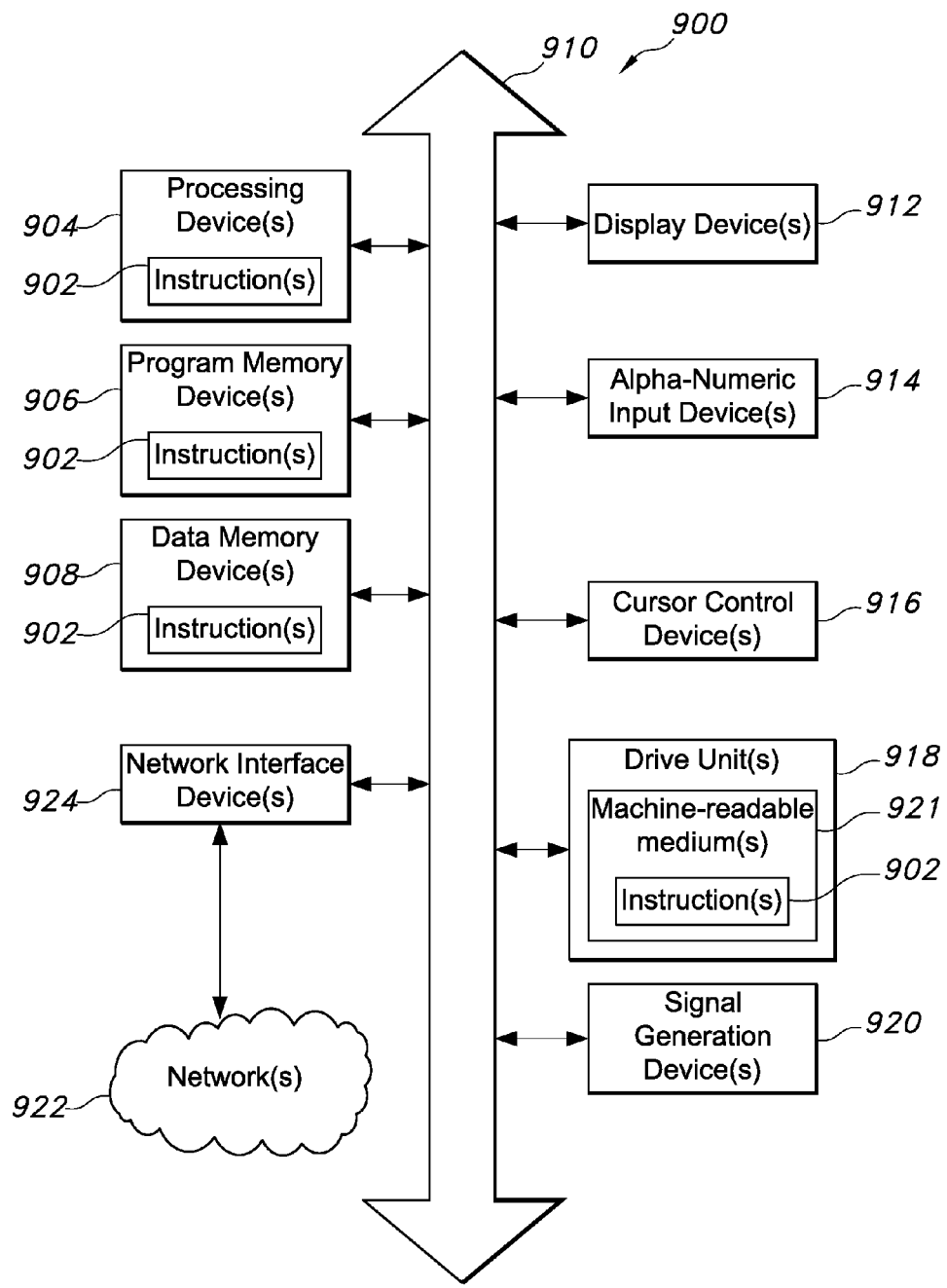
FIG. 10 is a block diagram of at least a portion of an exemplary machine in the form of a computing system that performs methods according to one or more embodiments disclosed herein.

One or more embodiments disclosed herein, or a portion thereof, may make use of software running on a computer or workstation. By way of example, only and without limitation, FIG. 10 is a block diagram of an embodiment of a machine in the form of a computing system 900, within which is a set of instructions 902 that, when executed, cause the machine to perform any one or more of the methodologies according to embodiments of the invention. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device (s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device (s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device (s) 914, cursor control device(s) 916, signal generation device(s) 920, etc., can be collectively referred to as an "input/output interface," and is intended to include one or more mechanisms for inputting data to the processing device (s) 904, and one or more mechanisms for providing results associated with the processing device(s). Input/output or I/O devices (including but not limited to keyboards (e.g., alphanumeric input device(s) 914, display device(s) 912, and the like) can be coupled to the system either directly (such as via bus 910) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited to, personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A magnetically enhanced sputtering apparatus comprising:
    a hollow cathode target assembly;
    an anode positioned on top of the hollow cathode target assembly, thereby forming a gap between the anode and the hollow cathode target assembly;
    a cathode magnet assembly;
    two rows of magnets facing each other with the same magnetic field direction that generate a cusp magnetic field in the gap and a magnetic field on a surface of the hollow cathode target assembly with the cathode magnet assembly, the magnetic field comprising magnetic field lines that are substantially perpendicular to the hollow cathode target assembly; and
    a pole piece positioned between the two rows of magnets and connected to a voltage power supply, the voltage power supply generating a train of negative voltage pulses that generates a pulse electric field in the gap perpendicular to the cusp magnetic field, the electric field igniting and sustaining plasma during a pulse of the train of negative voltage pulses, a frequency, duration and amplitude of the train of negative voltage pulses being selected to increase a degree of ionization of feed gas atoms.

2. The magnetically enhanced apparatus, as defined by claim 1, further comprising a second gap positioned inside the anode such that a portion of the magnetic field lines forming the cusp magnetic field cross the gap and terminate on top of a second row of magnets.

3. The magnetically enhanced apparatus, as defined by claim 1, further comprising a radio frequency (RF) power supply connected to the hollow cathode target assembly, the RF power supply generating output voltage with a frequency in a range of about 1 MHz to 100 MHz.

4. The magnetically enhanced apparatus, as defined by claim 1, wherein the power supply connected to the hollow cathode target assembly generates output current in a range of about 20 A to 200 A.

5. The magnetically enhanced apparatus, as defined by claim 1, further comprising:
    a substrate holder; and
    a substrate bias power supply, the substrate bias power supply being connected to the substrate holder and generating a bias voltage on the substrate in a range of about −10 V to −2000 V.

6. The magnetically enhanced apparatus, as defined by claim 1, wherein the magnetic field in the gap is in a range of about 50 G to 10000 G.

7. The magnetically enhanced apparatus, as defined by claim 1, wherein the cathode target material comprises carbon.

8. The magnetically enhanced as defined by claim 1, wherein the cathode target material comprises aluminum.

9. A method of magnetically enhanced sputtering comprising:
    providing a hollow cathode target assembly;
    forming a gap between the hollow cathode target assembly and an anode;
    positioning a cathode magnet assembly;
    generating a cusp magnetic field in the gap such that magnetic field lines are substantially perpendicular to a surface of the hollow cathode target assembly;
    positioning a pole piece in the gap connected to a power supply;
    providing a pulse DC power to the hollow cathode target assembly to ignite and sustain volume discharge;
    generating a train of negative voltage pulses using the power supply; and
    selecting a frequency, duration, and amplitude of the train of negative voltage pulses to increase a degree of ionization of sputtered target material atoms.

10. The method of magnetically enhanced sputtering, as defined by claim 9, further comprising positioning a second gap inside the anode such that the portion of the magnetic field lines forming the cusp magnetic field cross the gap and terminate on top of a second row of magnets.

11. The method of magnetically enhanced sputtering, as defined by claim 9, further comprising connecting a radio frequency (RF) power supply to the hollow cathode assembly and generating output voltage with a frequency in a range of about 1 MHz to 100 MHz.

12. The method of magnetically enhanced sputtering, as defined by claim 9, wherein the voltage power supply generates output voltage in a range of about −100 V to −3000 V.

13. The method of magnetically enhanced sputtering, as defined by claim 9, further comprising connecting a substrate bias power supply to a substrate holder and generating a bias voltage on a substrate in a range of about −10 V to −2000 V.

14. The method of magnetically enhanced sputtering, as defined by claim 9, wherein the magnetic field in the gap is in a range of about 50 G to 10000 G.

15. The method of magnetically enhanced sputtering, as defined by claim 9 wherein the cathode target material comprises carbon.

16. The method of magnetically enhanced sputtering, as defined by claim 9 wherein the cathode target material comprises aluminum.

* * * * *